United States Patent [19]

Seo et al.

[11] Patent Number: 5,960,053
[45] Date of Patent: Sep. 28, 1999

[54] METHOD AND APPARATUS FOR GENERATING A CLOCK SIGNAL HAVING A FREQUENCY EQUAL TO AN OSCILLATOR FREQUENCY DIVIDED BY A FRACTION

[75] Inventors: Toshio Seo, Twinsburg, Ohio; Jason Eric Waldeck, Lexington, Ky.

[73] Assignee: Lexmark International Inc, Lexington, Ky.

[21] Appl. No.: 08/858,871

[22] Filed: May 19, 1997

[51] Int. Cl.$^6$ ..................................... G11C 19/00
[52] U.S. Cl. ................................ 377/54; 377/33; 377/48; 327/299
[58] Field of Search .................................. 377/48, 54, 33; 327/115, 299; 364/703

[56] References Cited

U.S. PATENT DOCUMENTS 5,748,949   5/1998   Johnston ................................. 395/557

*Primary Examiner*—Margaret R. Wambach
*Attorney, Agent, or Firm*—Ronald K. Aust

[57] ABSTRACT

A method and apparatus for dividing a clock circuit employs a device having a first counting element capable of repetitively incrementing through the first plurality of states and a second counting element, having a second number of states, that generates a second output bit and repetitively increments through the second plurality of states. The first counting element is responsive to the second output bit of the second counting element and the reset signal input of the second counting element is responsive to at least one of the first plurality of output bits so that the second counting element resets to an initial state either when the oscillator signal is asserted and the second counting element counts through each of the second plurality of states or when the oscillator signal is asserted and the reset signal input is asserted and the second counting element has incremented through a preselected number of the second plurality of states. The first counting element increments whenever both the oscillator signal and the enable signal input are asserted. The first counting element and the second counting element, combined, have a predetermined third number of states. A circuit, responsive to the first plurality of output bits from the first counting element and the second output bit from the second counting element, asserts a quasi-periodic pulsed signal during a preselected subset of the third number of states, so that the quasi-periodic pulsed signal has a mean frequency equal to oscillator frequency divided by a fraction.

13 Claims, 3 Drawing Sheets

METHOD AND APPARATUS FOR GENERATING A CLOCK SIGNAL HAVING A FREQUENCY EQUAL TO AN OSCILLATOR FREQUENCY DIVIDED BY A FRACTION

BACKGROUND OF THE INVENTION

1. Field of the Invention

This invention relates to electronic clocking circuits. More particularly, this invention relates to a method and apparatus for generating a clock signal having a frequency equal to an oscillator frequency divided by a fraction.

2. The Prior Art

Portable electronic devices, such as laptop computers, commonly share data with peripheral devices and other computers. One way of sharing data is through a cable linking two devices. This is cumbersome and sometimes impossible. The Infrared Data Association (IRDA) sets standards for the use of infrared serial data as a wireless means for communication. The initial IRDA standard is based on a standard personal computer serial port. An additional IRDA standard includes a 1.152 megabit per second and a 4 megabit per second mode to the interface. In effecting the IRDA standard, it is preferable to implement all of the timing standards with a single system clock, such as a 32 MHz clock. However, existing technology cannot generate clock signals having all of the frequencies corresponding to the IRDA standards by dividing a signal input from a single 32 MHz clock, because 32 MHz cannot be evenly divided by the frequencies corresponding to the IRDA standards.

Common serial port data transmission speeds are multiples of 9600 bits per second. A clock frequency of 3.6864 MHz is typically used as the primary frequency for the data transmission. The data rate is determined by using a clock circuit, having a frequency equal to the primary frequency, and a divider circuit. Commonly, a multiple of the primary clock frequency is used as a sampling clock to account for phase, jitter and frequency variations between devices.

Frequency and jitter tolerance is small for an IRDA 4 megabit per second communication interface. Therefore, a sampling frequency which is an exact multiple of the bit rate must be used. In order to have at least four samples per bit time, the minimum clock frequency for a 4 megabit per second system is 32 MHz.

The IRDA 1.152 megabit per second standard uses a non-return to zero encoding within a 2 kilobyte (or less) frame length. Zero-insertion techniques ensure that a detectable pulse is transmitted at least every five bit times. This makes it possible to create a receiver circuit using a 32 MHz sampling clock since the zero-insertion ensures that re-synchronization takes place periodically. However, transmitting based on a 32 MHz clock is not possible because a cumulative bit error will occur over the frame length and violate the IRDA specification.

Given that the IRDA four megabit interface requires very tight tolerance on the clock circuit, using a 32 MHz clock would be desirable so as to use the lowest possible operating frequency, reduce switching currents and use a single synchronous clock design.

Several existing single-clock approaches exist. However they have the disadvantage of requiring a high speed system clock (e.g., a 48 MHz, or above, clock), which can lead to problems with electromagnetic compatibility and transmission effects. Furthermore, existing single-clock methods have the disadvantage of relying on generating a non-zero cumulative bit error that depends on frame length, which could become intolerable as frame length is expanded.

SUMMARY OF THE INVENTION

The above-noted disadvantages of the prior art are overcome by the present invention, which in one aspect is an apparatus for generating a pulsed clock signal in response to a series of periodic pulses from an oscillator, the periodic pulses having an oscillator frequency, the pulsed clock signal having a mean frequency equal to the oscillator frequency divided by a fraction having a numerator and a denominator. The apparatus has a counting circuit having a first number of states equal to the numerator and being capable of changing state upon sensing each periodic pulse from the oscillator. A circuit that is responsive to the counting circuit generates a plurality of quasi-periodic pulses during a preselected second number of the first number of states, the second number being equal to the denominator, the quasi-periodic pulses having a mean frequency equal to the oscillator frequency divided by the fraction.

In another aspect, the invention includes a first counting element, having a first plurality of states, responsive to an oscillator input from the oscillator and an enable signal input, for generating a first plurality of output bits, the first counting element capable of repetitively incrementing through the first plurality of states in a first predetermined order. A second counting element, having a second number of states, is responsive to an oscillator input from the oscillator and a reset signal input. The second counting element generates a second output bit and is capable of repetitively incrementing through the second plurality of states in a second predetermined order. The first counting element is responsive to the second output bit of the second counting element and the reset signal input of the second counting element is responsive to at least one of the first plurality of output bits from the first counting element so that the second counting element resets to an initial state either when the oscillator signal is asserted and the second counting element counts through each of the second plurality of states, or when the oscillator signal is asserted and the reset signal input is asserted and the second counting element has incremented through a preselected number of the second plurality of states. The first counting element increments whenever both the oscillator signal and the enable signal input are asserted. The first counting element and the second counting element, combined, have a predetermined third number of states. A circuit, responsive to the first plurality of output bits from the first counting element and the second output bit from the second counting element, asserts a quasi-periodic pulsed signal during a preselected subset of the third number of states, so that the quasi-periodic pulsed signal has a mean frequency equal to oscillator frequency divided by a fraction.

Yet another aspect of the invention is a method of generating a pulsed clock signal in response to a series of periodic pulses from an oscillator, the periodic pulses having an oscillator frequency, the pulsed clock signal having a frequency equal to the oscillator frequency divided by a fraction having a numerator and a denominator. A circuit increments through a first number of states equal to the numerator, each increment occurring at a periodic pulse from the oscillator. A plurality of quasi-periodic pulses is generated during a preselected second number of the first number of states, the second number being equal to the denominator, wherein the quasi-periodic pulses have at least two periods of different duration and a mean frequency equal to the oscillator frequency divided by the fraction.

An advantage of the invention is that it allows a standard oscillator to be used to generate pulses of a frequency having a fractional value of the oscillator's frequency.

Another advantage of the invention is that it allows use of a relatively lower frequency master clock than prior art systems.

Another advantage of the invention is that it allows generation of clock signals for each IRDA timing standard with a single system clock.

These and other advantages will become apparent from the following description of the preferred embodiment taken in conjunction with the following drawings, although variations and modifications may be effected without departing from the spirit and scope of the novel concepts of the disclosure.

DETAILED DESCRIPTION OF THE INVENTION

Figure 1:
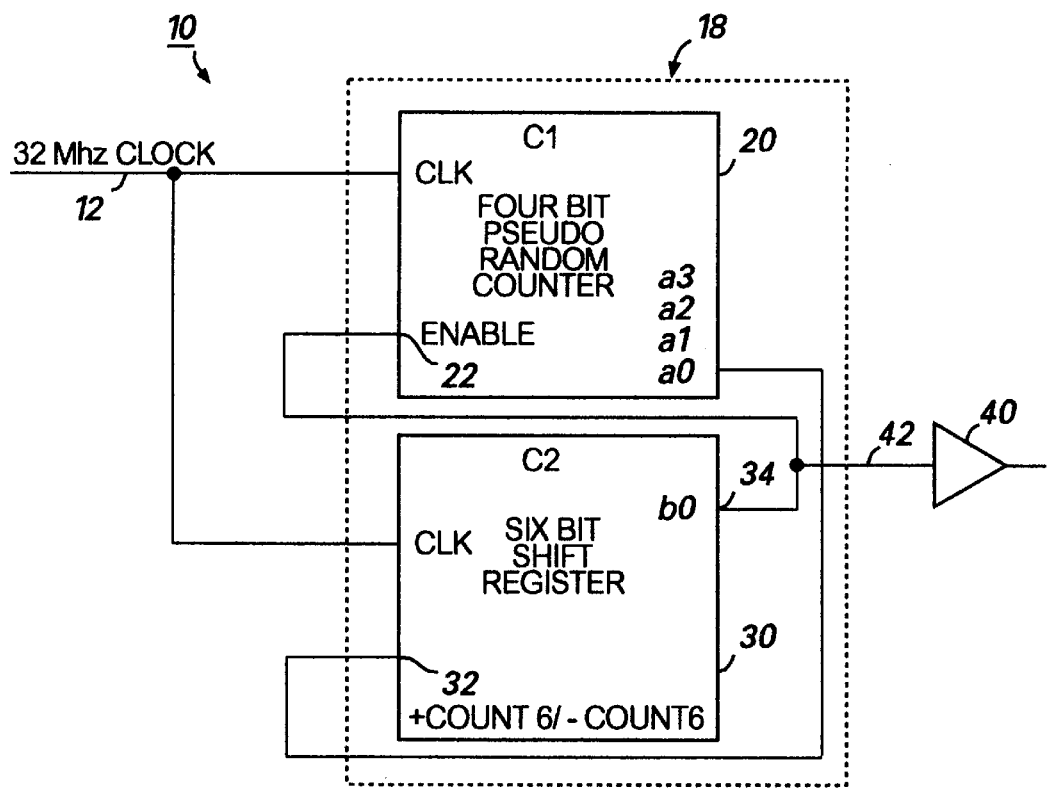
FIG. 1 is a schematic diagram of an embodiment of the invention.

A preferred embodiment of the invention is now described in detail. Referring to the drawings, like numbers indicate like parts throughout the views. As used in the description herein and throughout the claims that follow, "a," "an," and "the" includes plural reference unless the context clearly dictates otherwise. Also, as used in the description herein and throughout the claims that follow, the meaning of "in" includes "in" and "on" unless the context clearly dictates otherwise.

As shown in FIG. 1, an embodiment of the invention 10 that is designed to divide a 32 MHz oscillator clock signal input 12 by 5/50, thereby generating a 5.76 MHz clock signal 46 employs a counting circuit 18 having fifty states. A pulse is generated during nine of those fifty states. Thus, during nine out of every fifty 32 MHz pulses of the oscillator clock signal 12 a pulse is generated thereby generating the 5.76 MHz clock signal 42. Clock signal 42 may be conditioned by a driver 40.

The counting circuit 18 comprises a first counting element 20 and a second counting element 30. The first counting element 20 is a four bit pseudo-random counter that is responsive to a periodic pulse 12 from the oscillator and an enable signal input 22 and generates four output bits 24, designated as bits a3, a2, a1 and a0. Upon assertion of the periodic pulse 12 from the oscillator and the enable signal input 22, the first counting element 20 repetitively increments sequentially through the following states (corresponding to the values of bits a3, a2, a1, and a0): 1001; 1100; 0110; 1011; 0101; 1010; 1101; 1110; and 1111.

The second counting element 30 is a six-bit shift register (having bits designated as bits b5, b4, b3, b2, b1 and b0) and is responsive to the periodic pulse 12 from the oscillator and a reset signal input 32 that causes the second counting element 30 to reset to an initial state after passing through five states if the reset signal input 32 is asserted. If the reset signal input 32 is not asserted, the second counting element 30 will reset to its initial state after incrementing through all six states. The second counting element 30 generates at lease one second output bit 34, which in this embodiment is bit b0. Upon assertion of the periodic pulse 12 from the oscillator, the second counting element 30 increments through the following states: 000001; 000010; 000100; 001000; 010000; 100000 (although, the second counting element 30 will reach state 100000 only if the reset signal input is not asserted).

Bit a0 from the first counting element 20 is input into the reset signal input 32 of the second counting element 30 so that when the second counting element 30 is in state 010000 and bit a0 is asserted (i.e., during states 1001; 1011; 0101; 1101; and 1111 of the first counting element 20), the second counting element 32 resets to its initial state (000001). When bit a0 is not asserted then the second counting element 30 will continue counting to state 100000 and then reset to its initial state.

The second output bit 34, bit b0, from the second counting element 30 is input into the enable signal input 22 of the first counting element 20 so that the first counting element 20 increments only when the second counting element 30 is reset to its initial state (000001 ). Thus, there are 50 total possible states (shown in APPENDIX A, attached hereto) for the first counting unit 20 and the second counting unit 30, together. Bit b0 34 is asserted during nine of the 50 possible states: either every five cycles of the periodic pulse 12 if bit a0 is not asserted, or every six cycles of the periodic pulse 12 if bit a0 is asserted. The mean frequency that bit b0 34 is asserted is equal to the frequency of the periodic pulse 12 divided by the fraction 9/50. The output of bit b0 30 generates a 5.76 MHz clock signal 42, which may be further conditioned by a driver 40.

Figure 2:
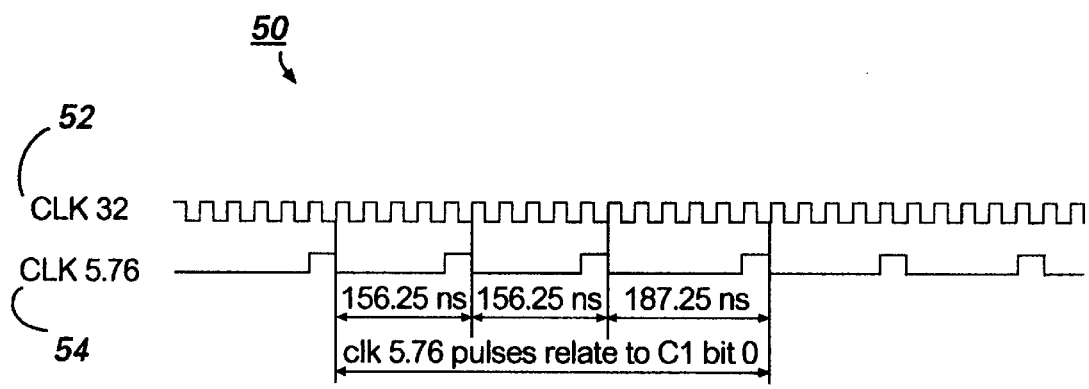
FIG. 2 is a timing diagram showing the relationship between oscillator pulses and quasi-periodic pulses.

FIG. 2 is a timing diagram 50 that shows the relationship between the 32 MHz oscillator clock signal 52 and the 5.76 MHz pulsed clock signal 54. The period between pulses of the pulsed clock signal 54 varies between 156.25 ns and 187.25 ns, thus the pulsed clock signal 54 is quasi-periodic. However, the mean period of the pulsed clock signal 54 is 173.61 ns, which corresponds to a frequency of 5.76 MHz.

Figure 3A:
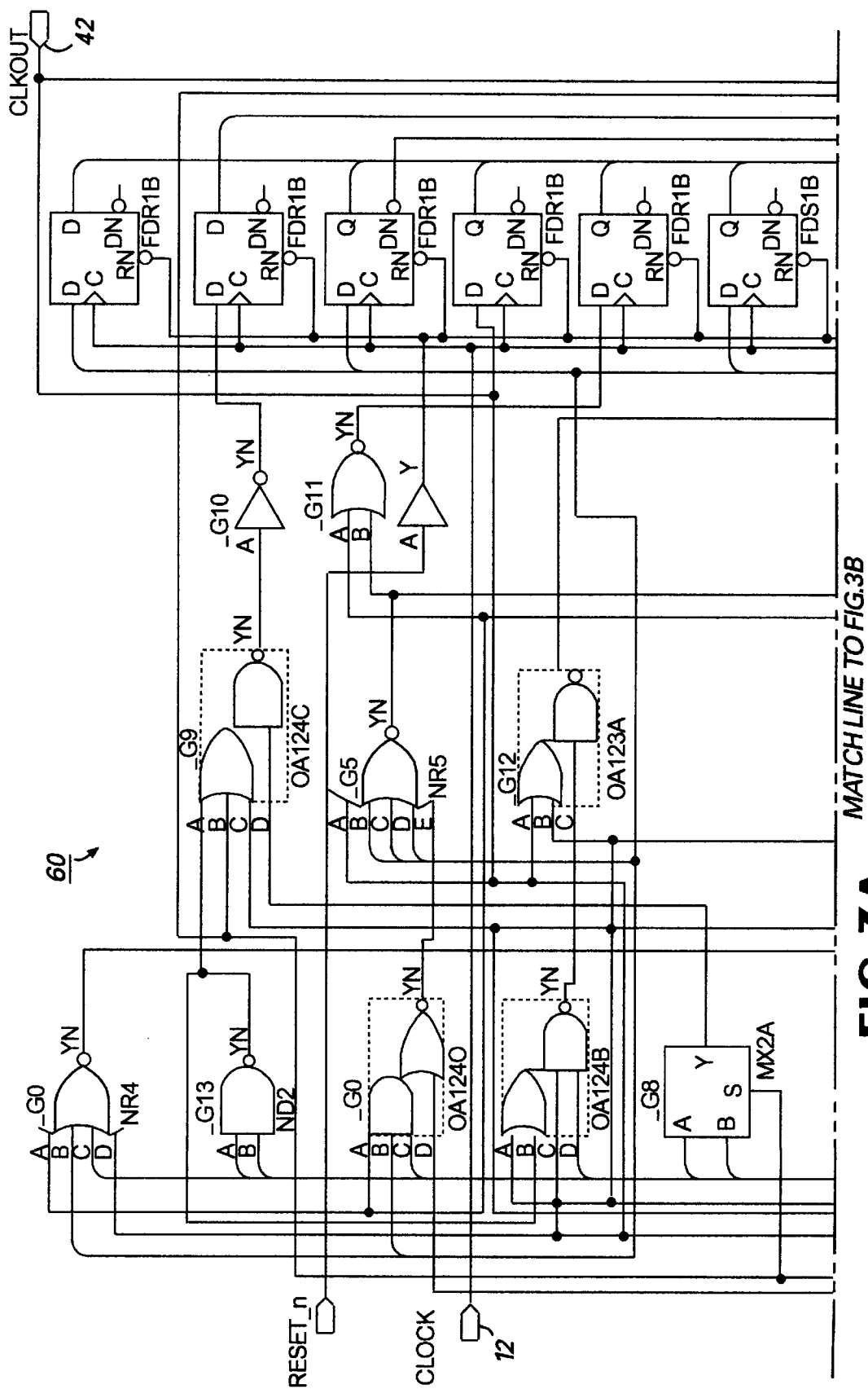
FIG. 3 is a logic diagram of a synthesis of one embodiment of the invention, VHDL code for which is disclosed in APPENDIX B of the specification.
Figure 3B:
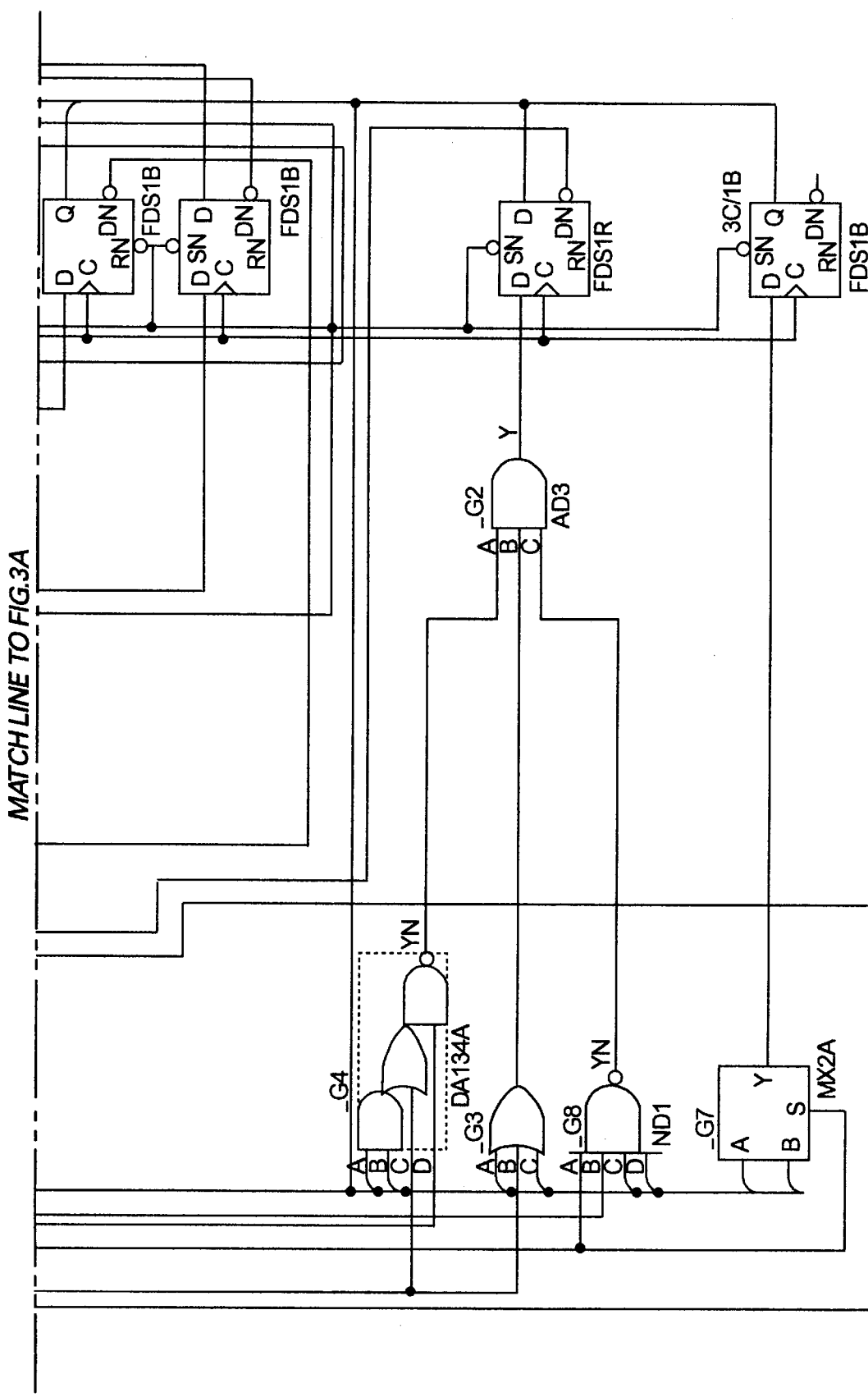

APPENDIX B, attached hereto, contains a logic description of the invention encoded in IEEE standard VHDL code. The logic description, when synthesized using a VHDL synthesis system of the type generally known to those of skill in the art of logic circuit design, generates a preferred hardware embodiment of the invention. FIG. 3 shows a logic diagram 60 of a synthesis for the VHDL code disclosed in APPENDIX B.

The above described embodiment is given as an illustrative example only. It will be readily appreciated that many deviations may be made from the specific embodiment disclosed in this specification without departing from the invention. Accordingly, the scope of the invention is to be determined by the claims below rather than being limited to the specifically described embodiment above.

| APPENDIX A COUNTING CIRCUIT STATES ||
|---|---|
| C1 aaaa 3210 | C2 bbbbbb 543210 |
| 1001 | 000001 |
| 1001 | 000010 |
| 1001 | 000100 |
| 1001 | 001000 |

APPENDIX A
COUNTING CIRCUIT STATES

| C1 | C2 |
|---|---|
| aaaa | bbbbbb |
| 3210 | 543210 |
| 1001 | 010000 |
| 1001 | 100000 |
| 1100 | 000001 |
| 1100 | 000010 |
| 1100 | 000100 |
| 1100 | 001000 |
| 1100 | 010000 |
| 0110 | 000001 |
| 0110 | 000010 |
| 0110 | 000100 |
| 0110 | 001000 |
| 0110 | 010000 |
| 1011 | 000001 |
| 1011 | 000010 |
| 1011 | 000100 |
| 1011 | 001000 |
| 1011 | 010000 |
| 1011 | 100000 |
| 0101 | 000001 |
| 0101 | 000010 |
| 0101 | 000100 |
| 0101 | 001000 |
| 0101 | 010000 |
| 0101 | 100000 |
| 1010 | 000001 |
| 1010 | 000010 |
| 1010 | 000100 |
| 1010 | 001000 |
| 1010 | 010000 |
| 1101 | 000001 |
| 1101 | 000010 |
| 1101 | 000100 |
| 1101 | 001000 |
| 1101 | 010000 |
| 1101 | 100000 |
| 1110 | 000001 |
| 1110 | 000010 |
| 1110 | 000100 |
| 1110 | 001000 |
| 1110 | 010000 |
| 1111 | 000001 |
| 1111 | 000010 |
| 1111 | 000100 |
| 1111 | 001000 |
| 1111 | 010000 |
| 1111 | 100000 |

APPENDIX B
VHDL SOURCE CODE

```
LIBRARY IEEE;
USE IEEE.STD_LOGIC_1164.ALL;
USE IEEE.STD_LOGIC_ARITH.ALL;
ENTITY clkgen 18
    PORT(
        reset_n : IN std_logic;
        clock: IN std_logic;
        clkout: OUT std_logic
        );
END clkgen;
ARCHITECTURE clkgen_a OF clkgen IS
    signal C1: std_logic_vector(3 downto 0);
    signal C2: std_logic_vector(5 downto 0);
BEGIN
clkout <=C2(0)
PROCESS (clock.reset_n)
BEGIN
    IF (reset_n='0') THEN
        C1 <='1001';
    ELSEIF (clock event AND clock='1') THEN
```

APPENDIX B
VHDL SOURCE CODE

```
        IF (C2(0)='1') THEN
            IF(C1="1111")THEN
                C1 <="1001";
            ELSE
                C1 <=(C1(0) XOR C1(1) & C1(3 downto 1);
            END IF;
        ELSE
            C1 <=C1;
        ENDIF;
    ENDIF;
ENDPROCESS
PROCESS (clock reset_n)
BEGIN
    IF (reset_n='0') THEN
        C2 <="000001";
    ELSIF (clock'event AND clock='1') THEN
        IF (C1(0) ='0' AND C2="010000) THEN
            C2 <="000001";
        ELSIF (C1(0) ='1' AND C2="100000") THEN
            C2 <="000001";
        ELSE
            C2 <=C2(4 downto 0) & '0';
        ENDIF;
ENDPROCESS;
```

We claim:

1. An apparatus for generating a pulsed clock signal in response to a series of periodic pulses from an oscillator, the periodic pulses having an oscillator frequency, the pulsed clock signal having a mean frequency equal to the oscillator frequency divided by a fraction having a numerator and a denominator, comprising:

a. a counting circuit having a first number of states equal to the numerator and being capable of changing state upon sensing each periodic pulse from the oscillator; and b. means, responsive to the counting circuit, for asserting a plurality of quasi-periodic pulses during a preselected second number of the first number of states, the second number being equal to the denominator, the quasi-periodic pulses having a mean frequency equal to the oscillator frequency divided by the fraction.

2. The apparatus of claim 1, wherein the counting circuit comprises:

a. a first counting element, having a first plurality of states, responsive to a periodic pulse from the oscillator and an enable signal input, for generating a first plurality of output bits, the first counting element capable of repetitively incrementing through the first plurality of states in a first predetermined order;

b. a second counting element, having a second plurality of states, responsive to the periodic pulse from the oscillator and a reset signal input, for generating a second output bit, the second counting element capable of repetitively incrementing through the second plurality of states in a second predetermined order;

the first counting element being responsive to the second output bit of the second counting element and the reset signal input of the second counting element being responsive to at least one of the first plurality of output bits so that the second counting element resets to an initial state either:

i. when the oscillator signal is asserted and the second counting element counts through each of the second plurality of states; or ii. when the oscillator signal is asserted and the reset signal input is asserted and the second counting element has incremented through a preselected number of the second plurality of states, and so that the first counting element increments whenever both the oscillator signal and the enable signal input are asserted.

3. The apparatus of claim 2, wherein the first counting element comprises a pseudo-random counter.

4. The apparatus of claim 3, wherein the pseudo-random counter is a four bit pseudo-random counter having four output bits that, upon assertion of the periodic pulse from the oscillator and the enable signal input, increments sequentially through the following states: 1001; 1100; 0110; 1011; 0101; 1010; 1101; 1110; and 1111.

5. The apparatus of claim 4, wherein the second counting element comprises a shift register.

6. The apparatus of claim 5, wherein the shift register is a six bit shift register having six output bits that, upon assertion of the periodic pulse from the oscillator, increments through the following states: 000001; 000010; 000100; 001000; 010000; 100000.

7. The apparatus of claim 6, wherein the output bits of the pseudo-random counter are designated bit a3, bit a2, bit a1 and bit a0, respectively, and wherein bit a0 of the pseudo-random counter is coupled to the reset signal input of the shift register so that the shift register resets to state 000001 when bit a0 of the pseudo-random counter is asserted and when the shift register is in state 010000.

8. The apparatus of claim 6, wherein the output bits of the shift register are designated bit b5, bit b4, bit b3, bit b2, bit b1, and bit b0, respectively, and wherein bit b0 of the shift register is coupled to the enable signal input of the pseudo-random counter so that the pseudo-random counter increments only when both the periodic pulse from the oscillator and bit b0 of the shift register are asserted.

9. The apparatus of claim 8, wherein the means for asserting a plurality of quasi-periodic pulses comprises a signal driver, having bit b0 as its input, that generates a signal having the logical value of bit b0.

10. The apparatus of claim 2, wherein the second counting element comprises a shift register.

11. The apparatus of claim 2, wherein the means for asserting a plurality of quasi-periodic pulses comprises a decoder circuit, responsive to the first plurality of output bits from the first counting element and the second output bit from the second counting element, that asserts a quasi-periodic pulsed signal during a preselected subset of the third number of states, so that the quasi-periodic pulsed signal has a mean frequency equal to oscillator frequency divided by a fraction.

12. A clock divider for dividing a periodic signal from an oscillator signal having an oscillator frequency, comprising:
a. a first counting element, having a first plurality of states, responsive to an oscillator input from the oscillator and an enable signal input, for generating a first plurality of output bits, the first counting element capable of repetitively incrementing through the first plurality of states in a first predetermined order;
b. a second counting element, having a second number of states, responsive to an oscillator input from the oscillator and a reset signal input, for generating a second output bit, the second counting element capable of repetitively incrementing through the second plurality of states in a second predetermined order;
the first counting element being responsive to the second output bit of the second counting element and
the reset signal input of the second counting element being responsive to at least one of the first plurality of output bits so that the second counting element resets to an initial state either:
  i. when the oscillator signal is asserted and the second counting element counts through each of the second plurality of states; or
  ii. when the oscillator signal is asserted and the reset signal input is asserted and the second counting element has incremented through a preselected number of the second plurality of states, and
so that the first counting element increments whenever both the oscillator signal and the enable signal input are asserted, and
so that the first counting element and the second counting element, combined, have a predetermined third number of states; and
c. means, responsive to the first plurality of output bits from the first counting element and the second output bit from the second counting element, for asserting a quasi-periodic pulsed signal during a preselected subset of the third number of states, so that the quasi-periodic pulsed signal has a mean frequency equal to oscillator frequency divided by a fraction.

13. A method of generating a pulsed clock signal in response to a series of periodic pulses from an oscillator, the periodic pulses having an oscillator frequency, the pulsed clock signal having a frequency equal to the oscillator frequency divided by a fraction having a numerator and a denominator, comprising the steps of:
a. incrementing through a first number of states equal to the numerator, each increment occurring at a periodic pulse from the oscillator; and
b. asserting a plurality of quasi-periodic pulses during a preselected second number of the first number of states, the second number being, equal to the denominator, wherein the quasi-periodic pulses have at least two periods of different duration and a mean frequency equal to the oscillator frequency divided by the fraction.

* * * * *